United States Patent
Tsorng et al.

(10) Patent No.: US 10,973,146 B1
(45) Date of Patent: Apr. 6, 2021

(54) TOOL-LESS MECHANISM FOR FIXING MULTIPLE ADD-ON CARDS

(71) Applicant: QUANTA COMPUTER INC., Taoyuan (TW)

(72) Inventors: Yaw-Tzorng Tsorng, Taoyuan (TW); Chun Chang, Taoyuan (TW); Yi-Huang Chiu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/727,613

(22) Filed: Dec. 26, 2019

Related U.S. Application Data

(60) Provisional application No. 62/923,008, filed on Oct. 18, 2019.

(51) Int. Cl.
*H05K 7/14* (2006.01)

(52) U.S. Cl.
CPC .................. *H05K 7/1489* (2013.01)

(58) Field of Classification Search
CPC .................................................. H05K 7/1489
See application file for complete search history.

(56) References Cited

U.S. PATENT DOCUMENTS

| | | | | |
|---|---|---|---|---|
| 6,320,760 B1* | 11/2001 | Flamm | ................. | H05K 7/1408 211/41.17 |
| 6,960,720 B2* | 11/2005 | Wen-Lung | ............. | G06F 1/186 174/17 R |
| 7,254,041 B2* | 8/2007 | Chen | ....................... | G06F 1/186 361/726 |
| 7,310,241 B2* | 12/2007 | Peng | ....................... | G06F 1/185 361/679.01 |
| 7,561,440 B2* | 7/2009 | Dai | ..................... | H05K 7/1408 312/223.2 |
| 7,974,100 B2* | 7/2011 | Chen | .................... | H05K 7/1408 361/747 |
| 8,203,852 B2* | 6/2012 | Wang | ..................... | G06F 1/186 361/801 |
| 8,411,461 B2* | 4/2013 | Zhou | ...................... | G06F 1/186 361/801 |
| 8,567,736 B2* | 10/2013 | Chen | ...................... | G06F 1/186 248/310 |
| 8,947,876 B2* | 2/2015 | Zhu | ........................ | G06F 1/185 361/679.58 |
| 9,049,785 B2* | 6/2015 | Yu | .......................... | G06F 1/181 |
| 9,826,655 B1* | 11/2017 | Di Ricco Kurzava | ... | G06F 1/18 |
| 2006/0120030 A1* | 6/2006 | Huang | .................... | G06F 1/186 361/679.02 |
| 2010/0214749 A1* | 8/2010 | Lee | ..................... | H05K 7/1409 361/754 |
| 2014/0301051 A1* | 10/2014 | Fu | ....................... | H05K 7/1487 361/759 |
| 2020/0068731 A1* | 2/2020 | Tsorng | ................ | H05K 5/0221 |

* cited by examiner

*Primary Examiner* — Daniel J Rohrhoff
(74) *Attorney, Agent, or Firm* — Nixon Peabody LLP

(57) ABSTRACT

An apparatus for securing multiple cards on a chassis includes a securing member, a support bracket, and at least one hinge. The at least one hinge is configured to hold the securing member to the support bracket such that the securing member has an axis of rotation about the support bracket. The spacing between the securing member and the support bracket is configured to hold a section of the multiple cards.

19 Claims, 12 Drawing Sheets

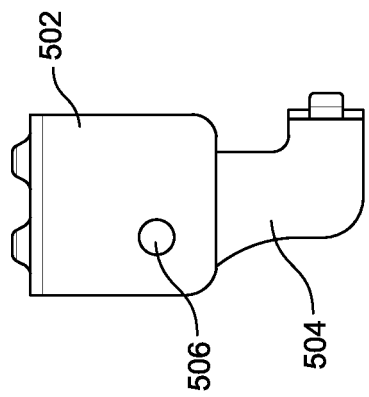
FIG. 5C
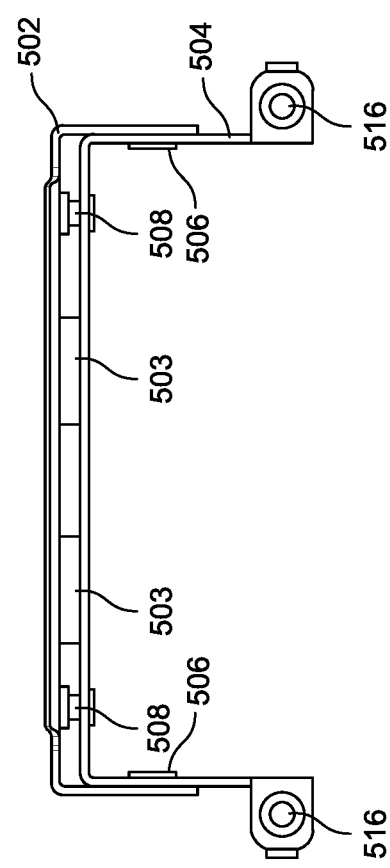
FIG. 5E
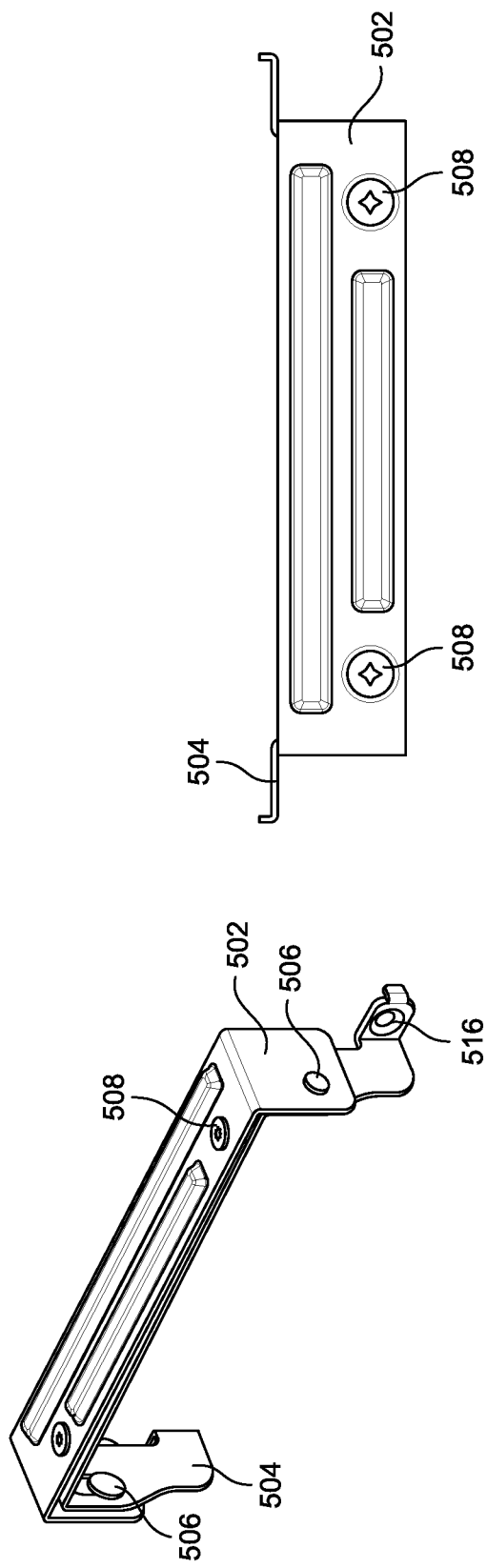
FIG. 5B
FIG. 5D

US 10,973,146 B1

TOOL-LESS MECHANISM FOR FIXING MULTIPLE ADD-ON CARDS

CROSS-REFERENCE TO RELATED APPLICATIONS

This patent application claims the benefit of U.S. Provisional Patent Application No. 62/923,008, filed Oct. 18, 2019. The contents of that application in its entirety are hereby incorporated by reference.

TECHNICAL FIELD

The present disclosure relates generally to systems and methods for securing multiple add-on cards in computing devices. More particularly, aspects of this disclosure relate to securing multiple peripheral component interconnect (PCI) cards to rear panels of computing devices.

BACKGROUND

Servers are employed in large numbers for high demand applications such as network based systems or data centers. Servers can include multiple components that can be swapped out. For example, when upgrading hardware components of a server, a hard-drive of the server can be removed and replaced with another hard-drive. Dual in-line memory modules (DIMMs) of the server can be removed and replaced with DIMMs of higher capacity or higher speed. Various cards of the server can be replaced with various other cards, etc. The server can have a motherboard that supports one or more bus standards including PCI, PCI Express (PCIe), accelerated graphics port (AGP), etc.

A computing system like a server can support the hot-swapping of components using one or more of the aforementioned one or more bus standards. For ease in hot-swapping, there is a need for a computing system that is amenable to accepting and releasing cards on demand. For example, when installing PCIe cards on a conventional server, the PCIe cards are installed one at a time. Each card is mechanically secured to a chassis of the server (e.g., mechanically secured with a screw). The process of installing PCIe cards can become time consuming for a technician, especially when many such cards need to be installed on multiple servers. Thus, the present disclosure is directed to reducing time required in installing cards in computing systems, and removing cards from computing systems.

SUMMARY

Some implementations of the present disclosure provide an apparatus for securing multiple cards on a chassis. The apparatus includes a securing member, a support bracket, and at least one hinge. The at least one hinge is configured to hold the securing member to the support bracket such that the securing member has an axis of rotation about the support bracket. The spacing between the securing member and the support bracket is configured to hold a section of the multiple cards.

In an embodiment, the axis of rotation is parallel to a length of the support bracket. In an embodiment, the axis of rotation is orthogonal to a length of the support bracket. In an embodiment, the apparatus further includes at least one screw for holding the securing member to the support bracket. The at least one screw is configured to prevent the securing member from rotating about the axis of rotation. In an embodiment, the securing member rotates in a plane parallel to a top surface of the support bracket.

In an embodiment, the apparatus further includes at least one spring positioned within the spacing between the securing member and the support bracket. In an embodiment, the securing member is configured to slide along the support bracket, thereby increasing or decreasing the spacing between the securing member and the support bracket. In an embodiment, the at least one hinge is configured to slide along the support bracket in response to the securing member sliding along the support bracket. In an embodiment, the securing member is further configured to be placed in at least one of three positions including: (a) a first position where a top surface of the securing member is parallel to a top surface of the support member, and the spacing between the securing member and the support bracket is at a first height; (b) a second position where the top surface of the securing member is parallel to the top surface of the support member, and the spacing between the securing member and the support bracket is at a second height larger than the first height; and (c) a third position where the top surface of the securing member, and the top surface of the support member are not parallel to each other.

Some implementations of the present disclosure provide a system including a chassis and an apparatus for securing multiple cards on the chassis. The apparatus includes a securing member, a support bracket, and at least one hinge. The at least one hinge is configured to hold the securing member to the support bracket such that the securing member has an axis of rotation about the support bracket. A spacing between the securing member and the support bracket is configured to hold a section of the multiple cards. The support bracket is secured to the chassis at one or more interfaces.

In an embodiment, the support bracket is secured to the chassis at the one or more interfaces using one or more rivets. In an embodiment, a portion of the chassis is contained within the spacing between the securing member and the support bracket.

In an embodiment, the axis of rotation is parallel to a length of the support bracket. In an embodiment, the axis of rotation is orthogonal to a length of the support bracket. In an embodiment, the apparatus further includes at least one screw for holding the securing member to the support bracket. The at least one screw is configured to prevent the securing member from rotating about the axis of rotation. In an embodiment, the securing member rotates in a plane parallel to a top surface of the support bracket.

In an embodiment, the apparatus further includes at least one spring positioned within the spacing between the securing member and the support bracket. In an embodiment, the securing member is configured to slide along the support bracket, thereby increasing or decreasing the spacing between the securing member and the support bracket. In an embodiment, the at least one hinge is configured to slide along the support bracket in response to the securing member sliding along the support bracket. In an embodiment, the securing member is further configured to be placed in at least one of three positions including: (a) a first position where a top surface of the securing member is parallel to a top surface of the support member, and the spacing between the securing member and the support bracket is at a first height; (b) a second position where the top surface of the securing member is parallel to the top surface of the support member, and the spacing between the securing member and the support bracket is at a second height larger than the first height; and (c) a third position where the top surface of the securing member, and the top surface of the support member are not parallel to each other.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

FIG. 5B illustrates a perspective view of the device of FIG. 5A when assembled.

FIGS. 5C, 5D, and 5E illustrate a top view, a front view, and a side view, respectively, of the assembled device of FIG. 5B.

Figure 1A:
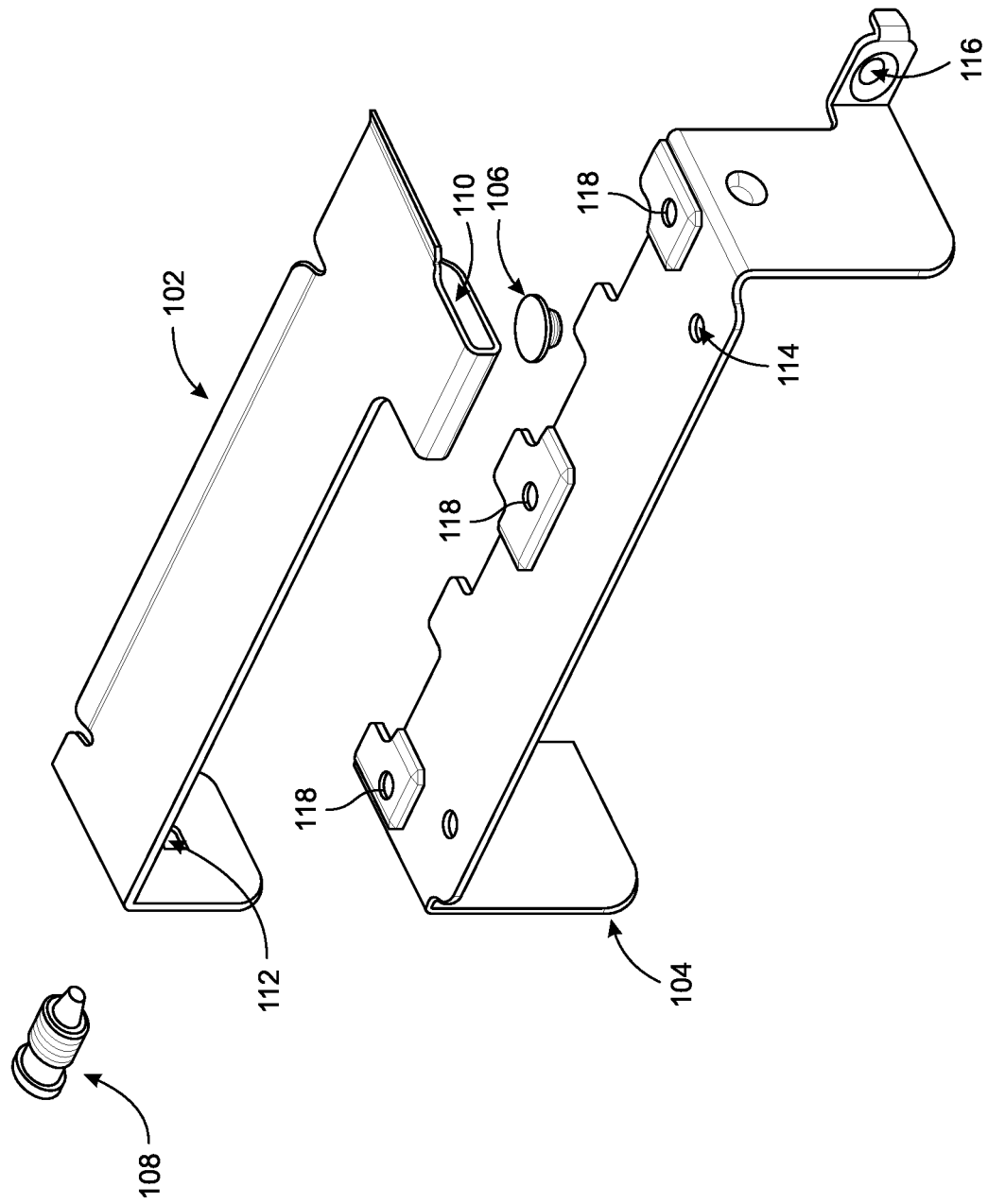
FIG. 1A illustrates components of a device for securing one or more cards to a chassis, according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Embodiments of the present disclosure provide systems and methods for retaining and securing multiple add-on cards simultaneously. Securing mechanisms like screws can be used to lock a securing structure that holds the add-on cards in place. The add-on cards can be inserted or removed by displacing the securing structure in a controlled manner. The displacement can involve swinging the securing structure from a first position to a second position, where in the first position, the add-on cards are held in place; and where in the second position, the add-on cards can be removed. Hand-operable screws can be used to secure the securing structure as well.

FIG. 1A illustrates components of a device for securing one or more cards to a chassis, according to some implementations of the present disclosure. The device includes a securing structure 102 (or fixing member), a support bracket 104, a hinge 106, and a locking mechanism 108. The securing structure 102 and/or the support bracket 104 can be metal components. The hinge 106 is configured to hold the securing structure 102 to the support bracket 104. The hinge 106 can be shaped such that the hinge 106 has a larger end and a smaller end. The smaller end of the hinge 106 is configured to interface with an opening 114 on the support bracket 104. The larger end of the hinge 106 is configured to sit within a loop 110 such that at least a portion of the securing structure 102 is sandwiched between the larger end of the hinge 106 and the support bracket 104.

When the securing structure 102 is attached to the support bracket 104 using the hinge 106, the securing structure 102 is configured to rotate or pivot about the hinge 106. An axis of rotation for the pivot is perpendicular to a top surface of the securing structure 102. In some embodiments, the axis of rotation is at a major axis of the hinge 106. Although a loop design with the loop 110 is provided, an alternative design without the loop 110 is also envisioned as long as the securing structure 102 is allowed to pivot about the hinge 106.

The device in FIG. 1A also includes the locking mechanism 108. The locking mechanism 108 is shown as a captive screw that can be tightened or released by hand. The locking mechanism 108 is received at an opening 112 on the securing structure 102, such that when the locking mechanism 108 is installed, the locking mechanism 108 mechanically couples the securing structure 102 and the support bracket 104. The mechanical coupling of the securing structure 102 to the support bracket 104 via the locking mechanism 108 prevents the securing structure 102 from rotating about the hinge 106. Although the locking mechanism 108 is provided as a captive screw, other methods of locking the securing structure 102 to the support bracket 104 are envisioned. For example, mechanical fasteners like latches can be used as the locking mechanism 108.

The support bracket 104 includes one or more interfaces for securing the support bracket 104 to a chassis. For example, the support bracket 104 can include holes 116 for receiving rivets on either side of the support bracket 104 for securing the support bracket 104 to a vertical wall of the chassis. The support bracket 104 can also include holes 118 for receiving rivets on a top surface of the support bracket 104 for securing the support bracket 104 to a horizontal wall of the chassis.

Figure 1C:
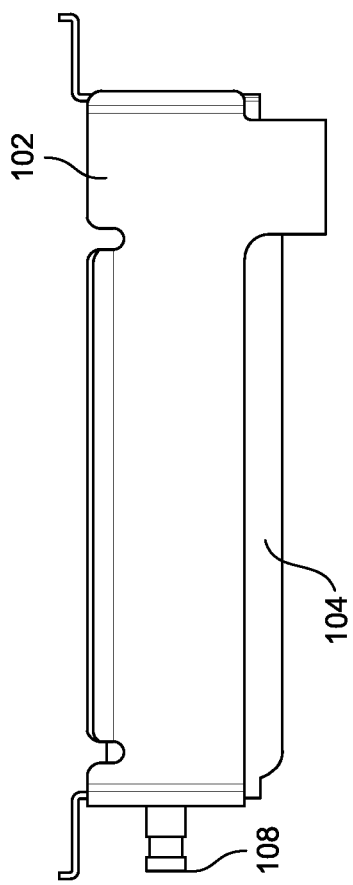
FIGS. 1C, 1D, and 1E illustrate a top view, a front view, and a side view, respectively, of the assembled device of FIG. 1B.
Figure 1E:
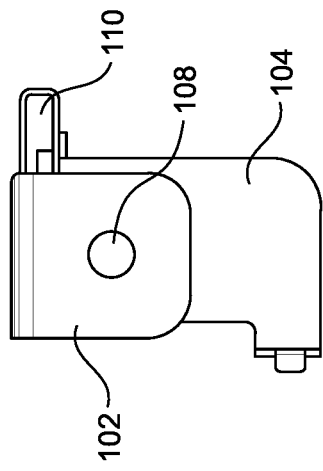
Figure 1B:
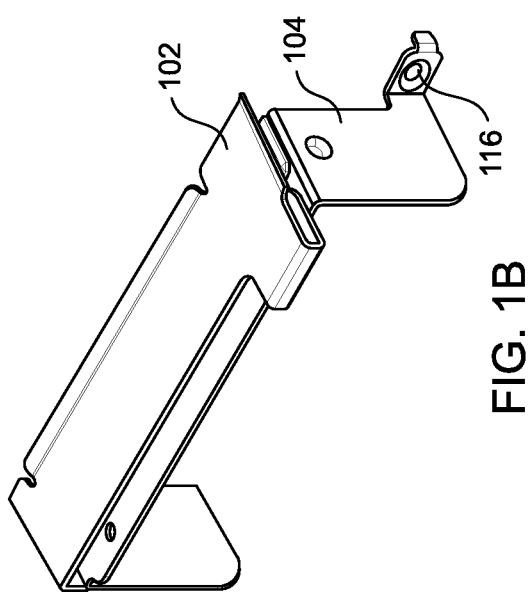
FIG. 1B illustrates a perspective view of the device of FIG. 1A when assembled.
Figure 1D:
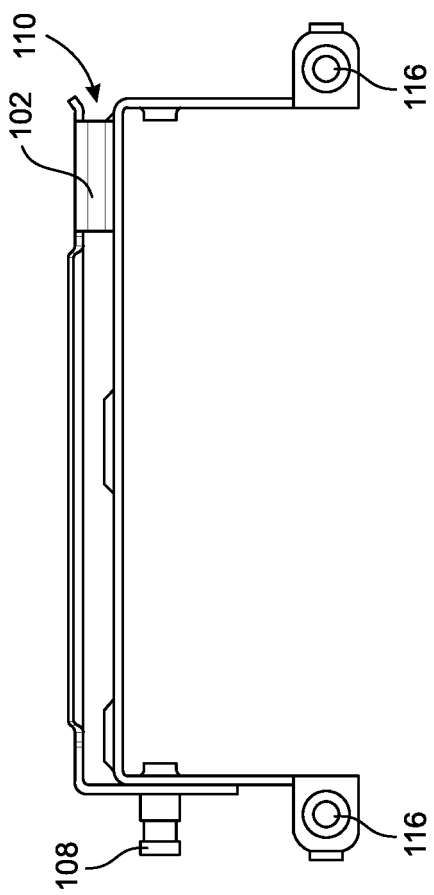

FIG. 1B illustrates a perspective view of the device of FIG. 1A when assembled, and when the securing structure 102 is secured to the support bracket 104 via the locking mechanism 108. FIGS. 1C, 1D, and 1E illustrate a top view, a front view, and a side view, respectively, of the assembled device of FIG. 1B. From the front view in FIG. 1D, a long edge of the securing structure 102 is substantially parallel to a long edge of the support bracket 104, such that a spacing is created between the securing structure 102 and the support bracket 104. A short edge of the securing structure 102 is substantially parallel to a short edge of the support bracket 104. The short edge of the securing structure 102 is held flushed against the short edge of the support bracket 104 by the locking mechanism 108.

Figure 2:
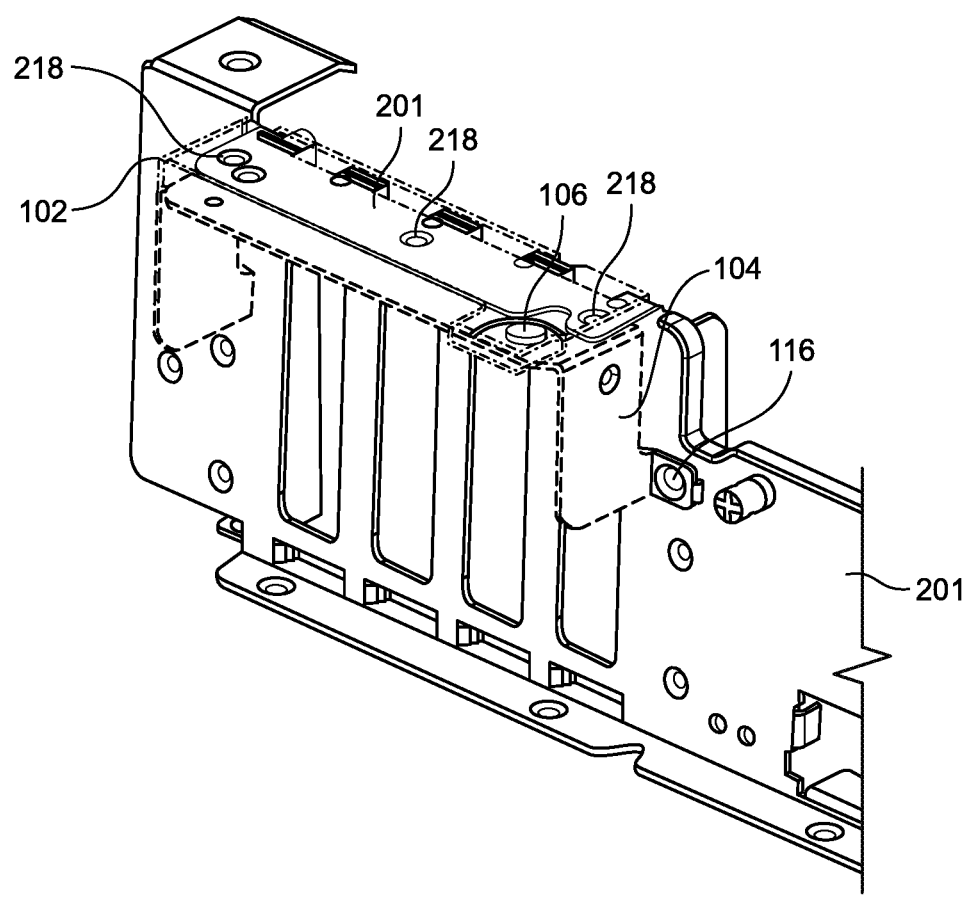
FIG. 2 illustrates the device of FIG. 1B attached to a chassis, according to some implementations of the present disclosure.

FIG. 2 illustrates the device of FIG. 1B attached to a chassis 201, according to some implementations of the present disclosure. The chassis 201 can be a chassis of a desktop computer, a server, a measurement equipment, or some other computing device. The chassis 201 is shown to include vertical portions and horizontal portions. Some horizontal portions of the chassis 201 fit within the spacing created between the securing structure 102 and the support bracket 104. The support bracket 104 is attached to vertical portions of the chassis 201 at interfaces where the holes 116 are located. The support bracket 104 is also attached to some horizontal portions of the chassis 201. The chassis 201 includes one or more interfaces at horizontal portions for securing the support bracket 104. For example, holes 218 are provided on the chassis 201 such that the holes 218 can substantially match the holes 118 on the support bracket 104. Rivets can be used in the holes 116 and/or the holes 218 to secure the support bracket 104 to the chassis 201.

Figure 3A:
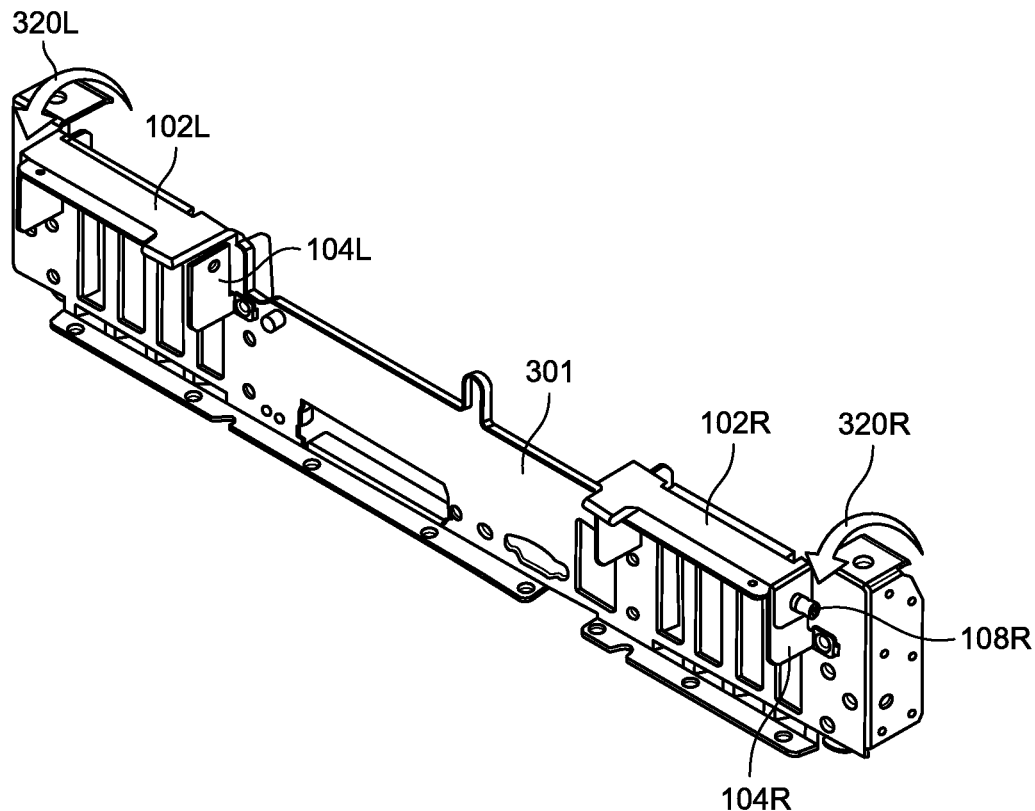
FIGS. 3A and 3B illustrate a process of unlocking the device of FIG. 1B to receive one or more cards.
Figure 3B:
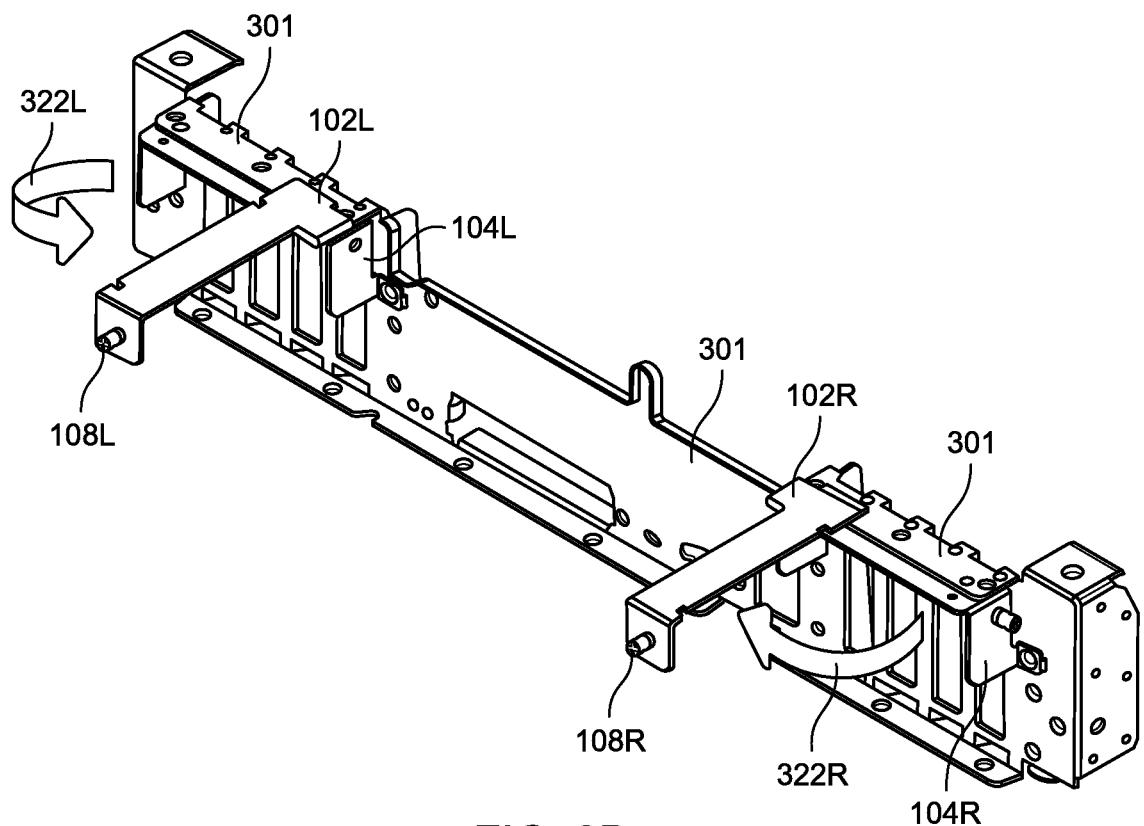

FIG. 3A-3B illustrate a process of unlocking the device of FIG. 1B to receive one or more cards. In FIG. 3A, a chassis 301 has two locations (a left location L and a right location R) for receiving the one or more cards. Each location has a device of FIG. 1B attached to the chassis 301, according to some implementations of the present disclosure. The reference numbers 1XX correspond to reference numbers 1XX as already described in connection with FIG. 1A. In FIG. 3A, an identifier, L or R, is attached to each of the reference numbers to indicate a left location L or a right location R, respectively.

Each of the devices of FIG. 1B is shown in a locked position in FIG. 3A, and in an unlocked position in FIG. 3B. In the locked position, an installed card is secured and a card not yet installed cannot be installed. To transition from the locked position to an unlocked position, the locking mechanism 108 (as depicted in FIGS. 1C-1E) is released. For example, referring to FIG. 3A, if the locking mechanism 108R is a captive screw, then to release the captive screw, the locking mechanism 108R is rotated in a counter clockwise direction 320R, and the locking mechanism 108L is rotated in a clockwise direction 320L. Direction of rotation is merely provided as an example. Releasing the locking mechanisms 108L and 108R allows the securing structures 102L and 102R to mechanically decouple from the support brackets 104L and 104R, respectively, at the locations of the locking mechanisms 108L and 108R. By mechanically decoupling the securing structures 102L and 102R from the support brackets 104L and 104R, respectively, the securing structures 102L and 102R are allowed to pivot at their respective hinges. FIG. 3B shows that the securing structures 102L and 102R move in directions indicated by arrows 322L and 322R, respectively. The securing structures 102L and 102R move to a position where horizontal portions of the chassis 301 are exposed.

Figure 4A:
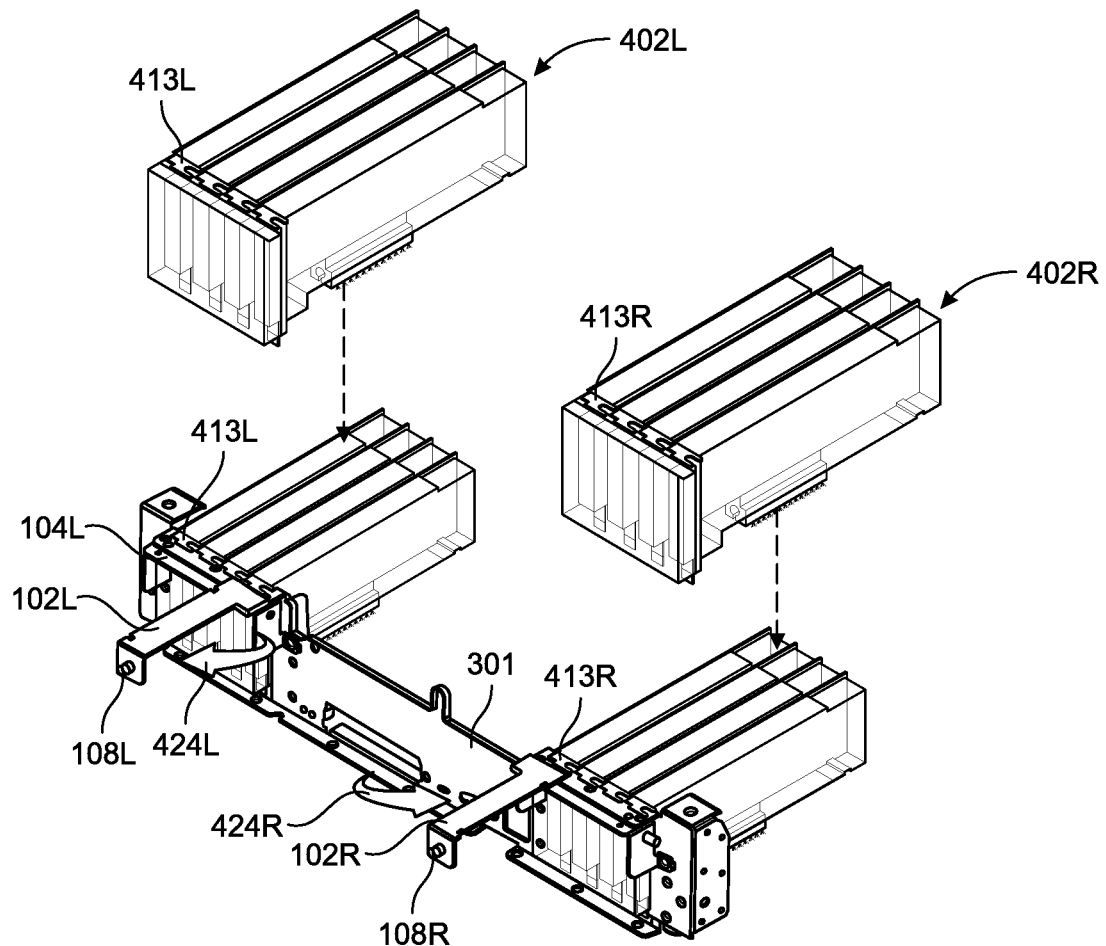
FIGS. 4A and 4B illustrate a process of installing cards to a chassis and securing the installed cards using the device of FIG. 1B, according to some implementations of the present disclosure.
Figure 4B:
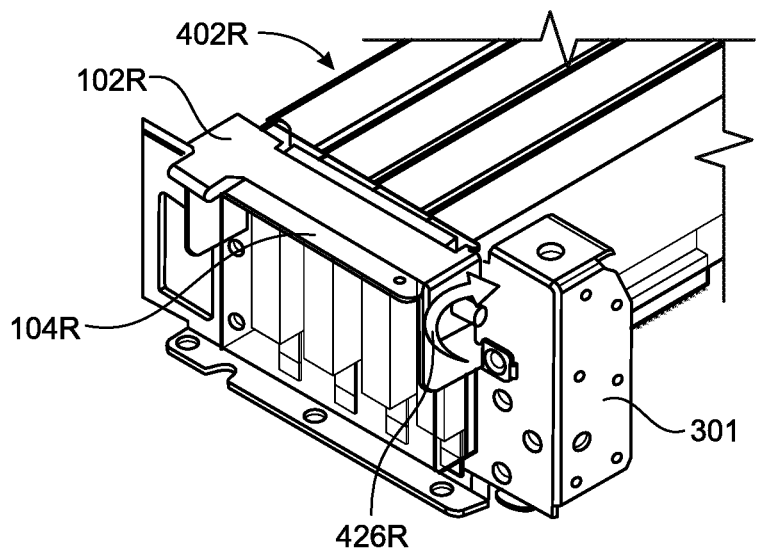

FIG. 4A-4B illustrate a process of installing multiple add-on cards 402L and 402R to the chassis 301 and securing the installed multiple add-on cards 402L and 402R, according to some implementations of the present disclosure. In FIG. 4A, the multiple add-on cards 402L and 402R are installed simultaneously as single units. Portions 413L and 413R of the multiple add-on cards 402L and 402R, respectively, rest above and parallel to the exposed horizontal portions of the chassis 301. When the multiple add-on cards 402L and 402R are properly installed, the securing structures 102L and 102R are able to pivot around their respective hinges in the directions indicated by arrows 424L and 424R, respectively. FIG. 4B illustrates a zoomed in view of the right location of the chassis 301. After the securing structure 102R pivots into place, the securing structure 102R substantially covers the portions 413R of the multiple add-on card 402R that rest on the horizontal portions of the chassis 301. The securing structure 102R, when in the position shown in FIG. 4B, prevents the multiple add-on card 402R from dislodging from the chassis 301. The locking mechanism 108R can be secured or tightened by rotating the locking mechanism 108R in a clockwise direction 426R.

Figure 5A:
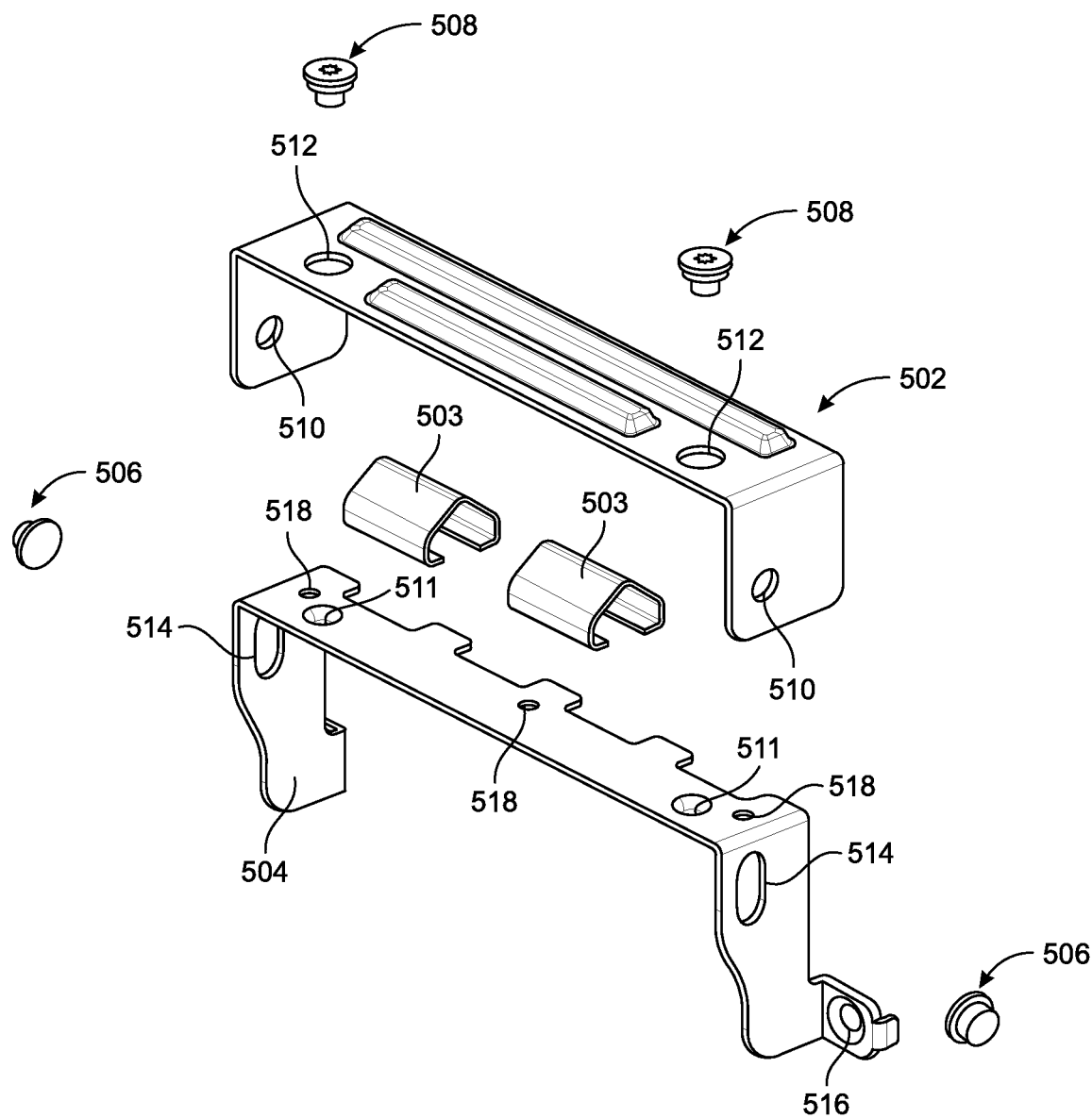
FIG. 5A illustrates components of a device for securing one or more cards to a chassis, according to some implementations of the present disclosure.

In FIG. 4B, a single locking mechanism 108R secures multiple add-on cards thus facilitating quickly removing and installing add-on cards. Degree of freedom of motion for the securing structure 102R is restricted to pivoting about a hinge such as the hinge 108 in FIG. 1A. FIG. 5A illustrates components of a device with a higher degree of freedom of motion, according to some implementations of the present disclosure.

The device in FIG. 5A includes a securing structure 502 (or fixing member), a support bracket 504, at least one hinge 506, and at least one locking mechanism 508. The securing structure 502 and/or the support bracket 504 can be metal components. Each hinge 506 is configured to hold the securing structure 502 to the support bracket 504. Each hinge 506 can be shaped in a similar fashion as the hinge 106 described in connection with FIG. 1A. Each hinge 506 can be configured to hold the securing structure 502 to the support bracket 504 via openings 514 and openings 510 on the support bracket 504 and the securing structure 502, respectively.

When the securing structure 502 is attached to the support bracket 504 using the at least one hinge 506, the securing structure 502 is configured to rotate or pivot about the at least one hinge 506. An axis of rotation for the pivot is parallel to a top surface of the support bracket 504. The openings 514 can be provided with a substantially oblong shape allowing the at least one hinge 506 to slide up and down within the substantially oblong shape of the openings 514. The at least one hinge 506 sliding up (or down) the openings 514 causes the securing structure 502 to move away from (or move toward) the support bracket 504.

In some embodiments, one or more springs 503 is provided within a spacing between the securing structure 502 and the support bracket 504. The spring 503 can be a metal spring facilitating contact between the support bracket 504 and the securing structure 502 and any cards being installed in the device of FIG. 5A. The contacts formed can create an equipotential between metal or conductive components of the spring 503, the securing structure 502, and the support bracket 504. The equipotential of the different metal or conductive components can serve as an electromagnetic interference shield.

The device in FIG. 5A also can also include one or more locking mechanisms 508. The locking mechanism 508 provides a similar functionality as the locking mechanism 108. The locking mechanism 508 prevents the securing structure 502 from moving towards or away from the support bracket 504, when the locking mechanism 508 is mechanically coupled to both the securing structure 502 and the support bracket 504. The locking mechanism 508 is shown in FIG. 5A as captive screws. The captive screws interface with the securing structure 502 via openings 512 and then with the support bracket 504 via openings 511. Two captive screws are used as examples but any number of captive screws (e.g., one, three, five, etc.) can be used as the locking mechanism 508. Similar to FIG. 1A, other types of mechanical couplers can be used as the locking mechanism 508 and not just captive screws.

The support bracket 504 includes one or more interfaces for securing the support bracket 504 to a chassis. For example, the support bracket 504 can include holes 516 for receiving rivets on either side of the support bracket 504 for securing the support bracket 504 to a vertical wall of the chassis. The support bracket 504 can also include holes 518 for receiving rivets on a top surface of the support bracket 504 for securing the support bracket 504 to a horizontal wall of the chassis.

FIG. 5B illustrates a perspective view of the device of FIG. 5A when assembled, and when the securing structure 502 is secured to the support bracket 504 via the locking mechanism 508. FIGS. 5C, 5D, and 5E illustrate a top view, a front view, and a side view, respectively, of the assembled device of FIG. 5B. From the front view in FIG. 5D, a long edge of the securing structure 502 is substantially parallel to a long edge of the support bracket 504, such that a spacing is created between the securing structure 502 and the support bracket 504. The one or more springs 503 are compressed to fit within a height of the spacing. Two short edges of the securing structure 502 are substantially parallel to two short edges of the support bracket 504. The short edges of the securing structure 502 are held flushed against the short edges of the support bracket 504 by the at least one hinge 506.

Figure 6:
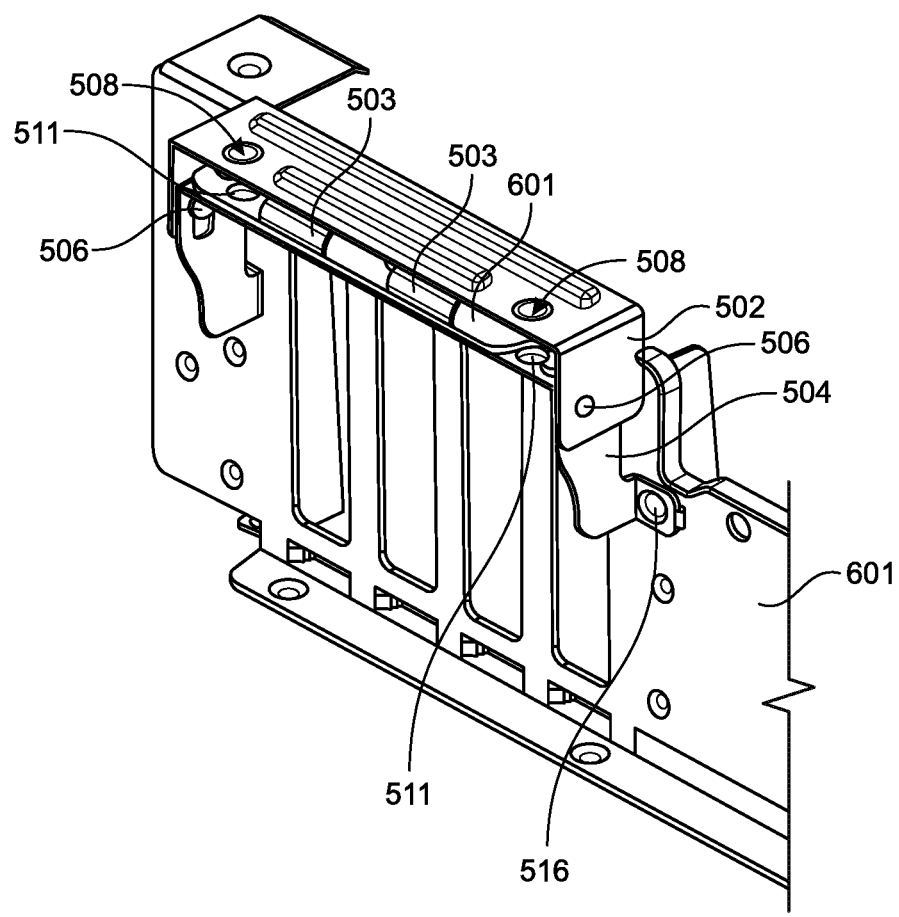
FIGS. 6 and 7A illustrate the device of FIG. 5B attached to a chassis, according to some implementations of the present disclosure.

FIG. 6 illustrates the device of FIG. 5B attached to a chassis 601, according to some implementations of the present disclosure. The chassis 601 is shown to include vertical portions and horizontal portions. Some horizontal portions of the chassis 601 fit within the spacing created between the securing structure 502 and the support bracket 504. The one or more springs 503 are shown to sit atop the horizontal portions of the chassis 601 within the spacing. The support bracket 504 is attached to vertical portions of the chassis 601 at interfaces where the holes 516 are located. The support bracket 504 is also attached to some horizontal portions of the chassis 601. The support bracket 504 can be attached to the horizontal portions of the chassis 601 in a similar manner as described in connection with FIG. 2. Rivets can be used in the holes 516 and/or the holes 518 to secure the support bracket 504 to the chassis 601. The device in FIG. 6 secured to the chassis 601 is in an unlocked position the locking mechanisms 508 do not interface with the openings 511.

Figure 7A:
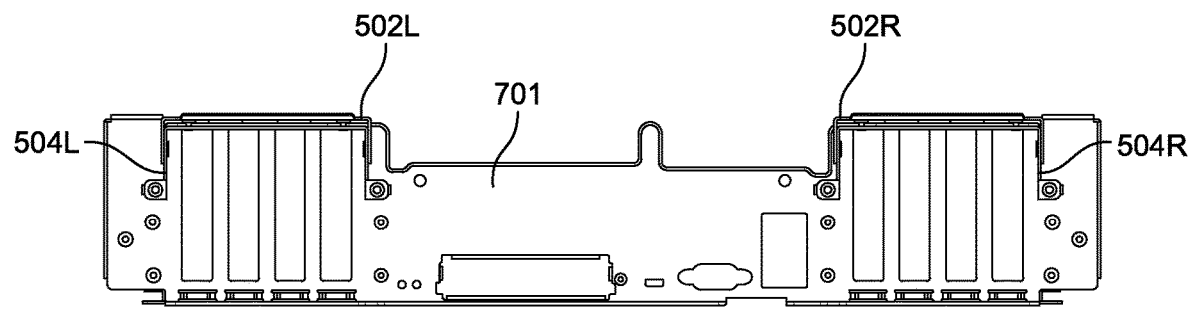

FIG. 7A illustrates a chassis 701 with two locations (a left location L and a right location R) for receiving one or more cards. Each location has a device of FIG. 5B attached to the chassis 701, according to some implementations of the present disclosure. The reference numbers 5XX correspond to reference numbers 5XX as already described in connection with FIG. 5A. In FIG. 7A, an identifier, L or R, is attached to each of the reference numbers to indicate a left location L or a right location R, respectively.

Figure 7B:
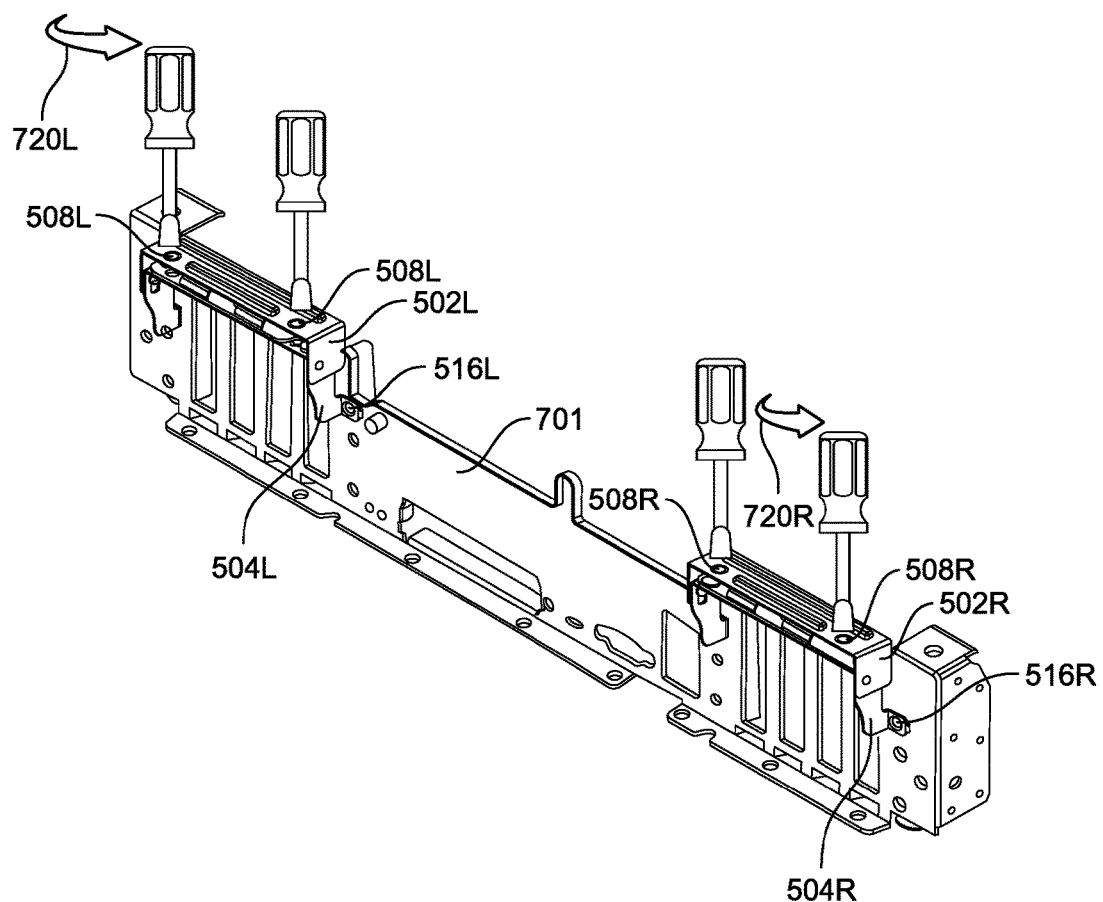
FIGS. 7B-7D illustrate a process of unlocking the device of FIG. 5B to receive one or more cards, according to some implementations of the present disclosure.
Figure 7C:
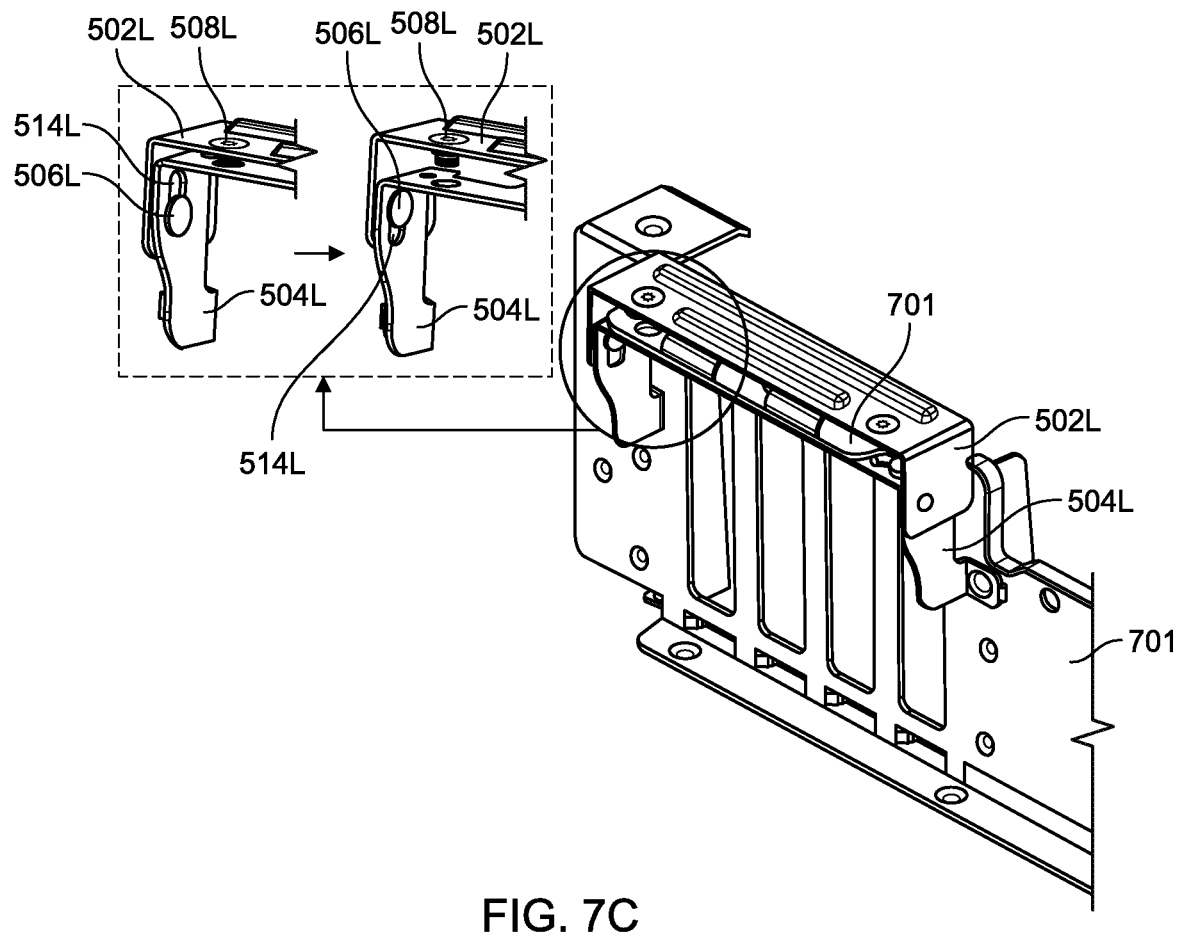
Figure 7D:
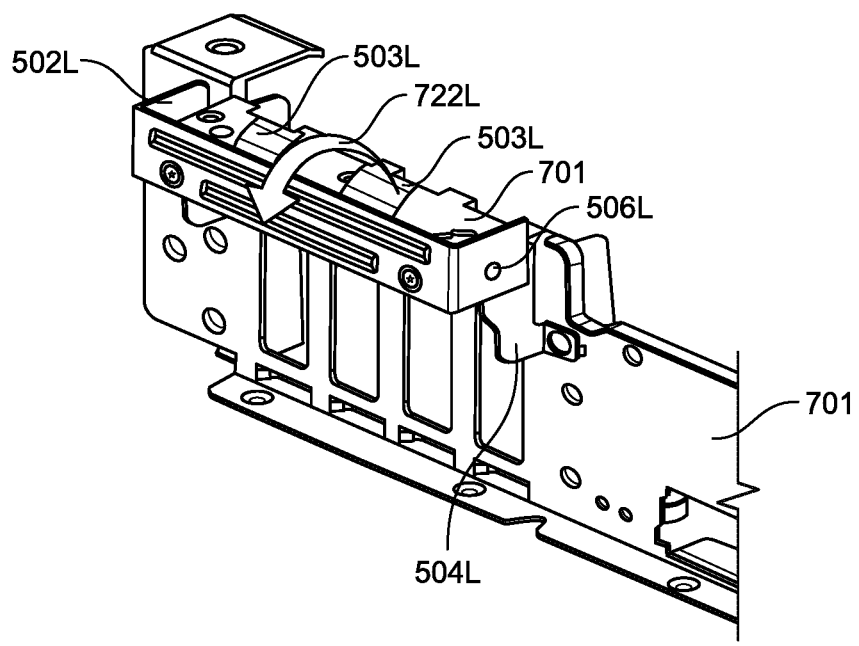

FIGS. 7B-7D illustrate a process of unlocking two devices of FIG. 7A to receive one or more cards, according to some implementations of the present disclosure. In FIG. 7B, the locking mechanisms 508L and 508R are released (e.g., a screw driver can be used to rotate the captive screws in a counterclockwise direction 720L and 720R). Releasing the locking mechanisms 508L and 508R allows the securing structures 502L and 502R to move away from the support brackets 504L and 504R, respectively. Each spacing between the securing structures 502L and 502R and the support brackets 504L and 504R, respectively, grows when the securing structures 502L and 502R slides away from the support brackets 504L and 504R, respectively.

The inset in FIG. 7C illustrates the locking mechanism 508L in a locked position holding the securing structure 502L closer to the support bracket 504L. The inset in FIG. 7C also illustrates the locking mechanism 508L being released such that the spacing between the securing structure 502L and the support bracket 504L is widened. As shown in the inset in FIG. 7C, the hinge 506L moves vertically along the oblong opening 514L. The springs 503L can help push or keep the wider separation between the securing structure 502L and the support bracket 504L when the locking mechanism 502L is released. In FIG. 7D, the securing structure 502L can be rotated about an axis of rotation defined by a location of the hinges 506L. Rotating the securing structure 502L in the direction 722L exposes horizontal portions of the chassis 701.

Figure 8A:
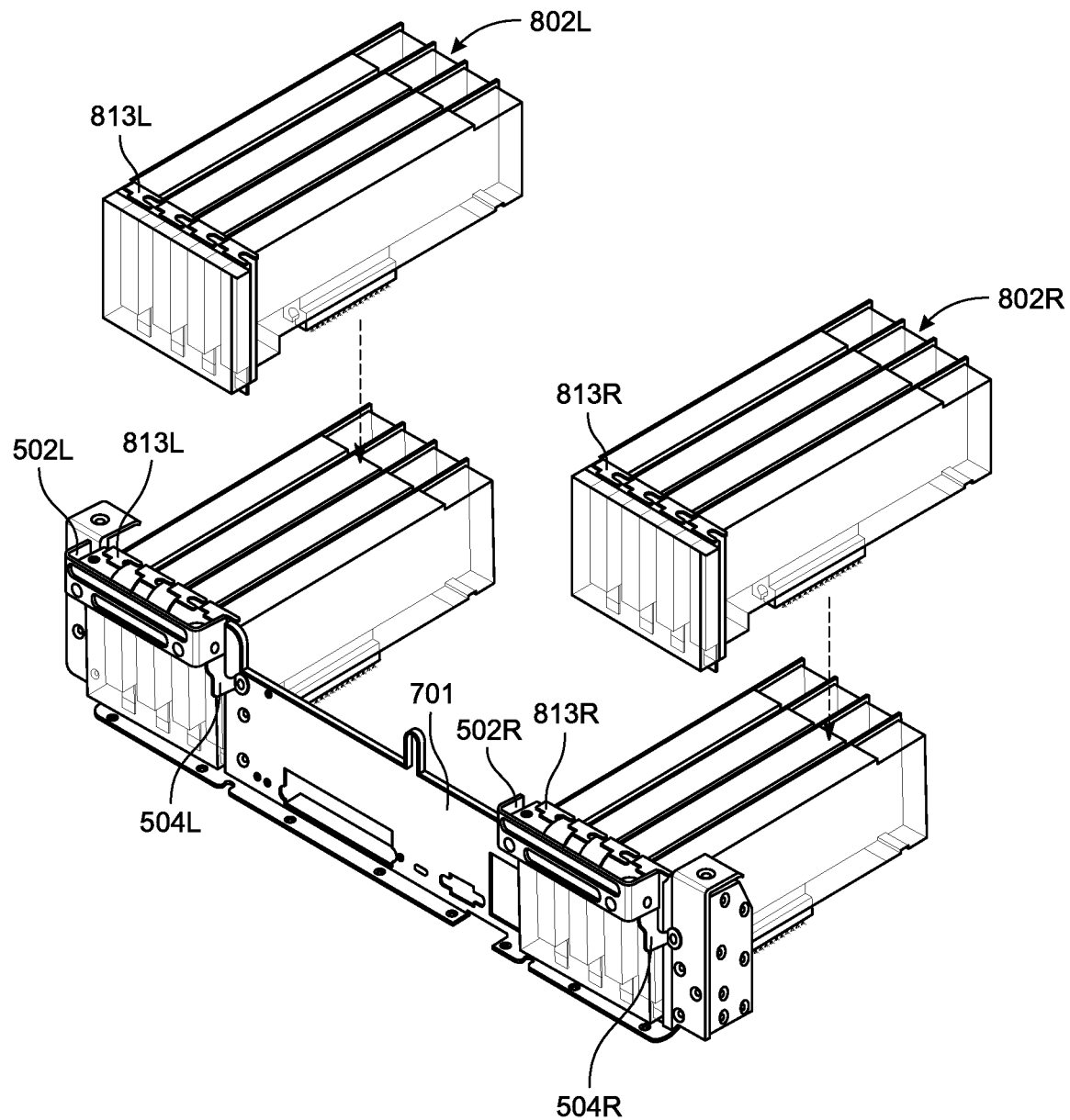
FIGS. 8A-8C illustrate a process of installing cards to a chassis and securing the installed cards using the device of FIG. 5B, according to some implementations of the present disclosure.
Figure 8B:
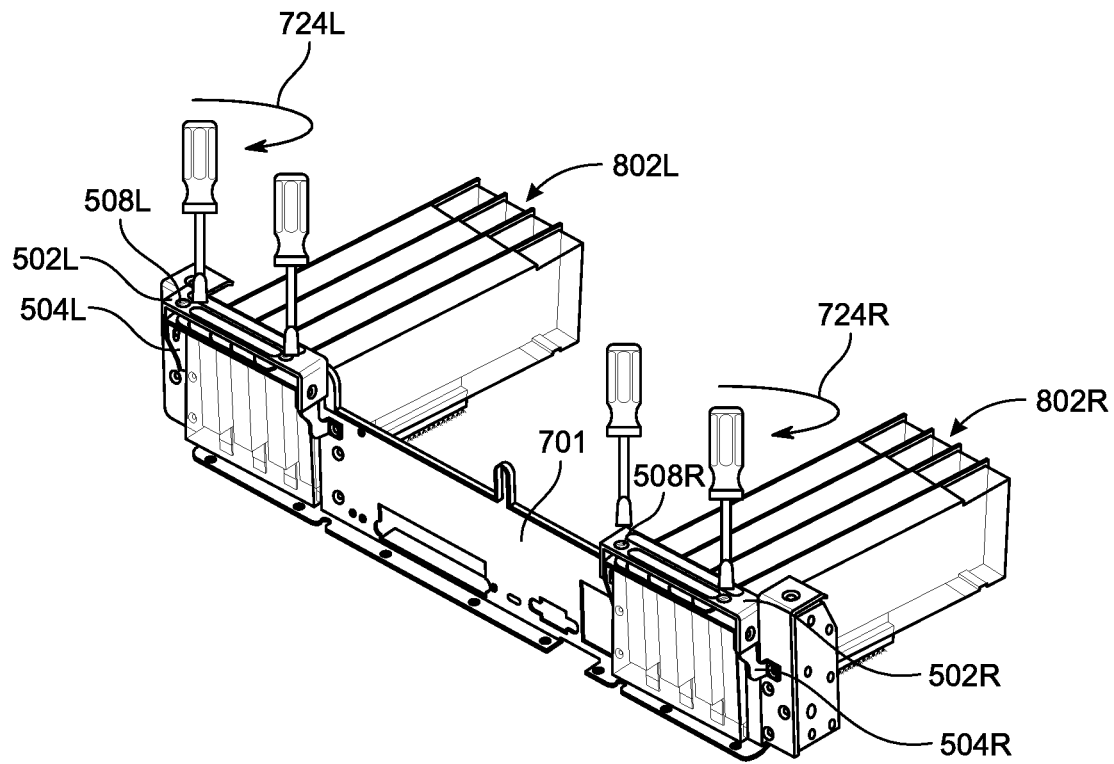
Figure 8C:
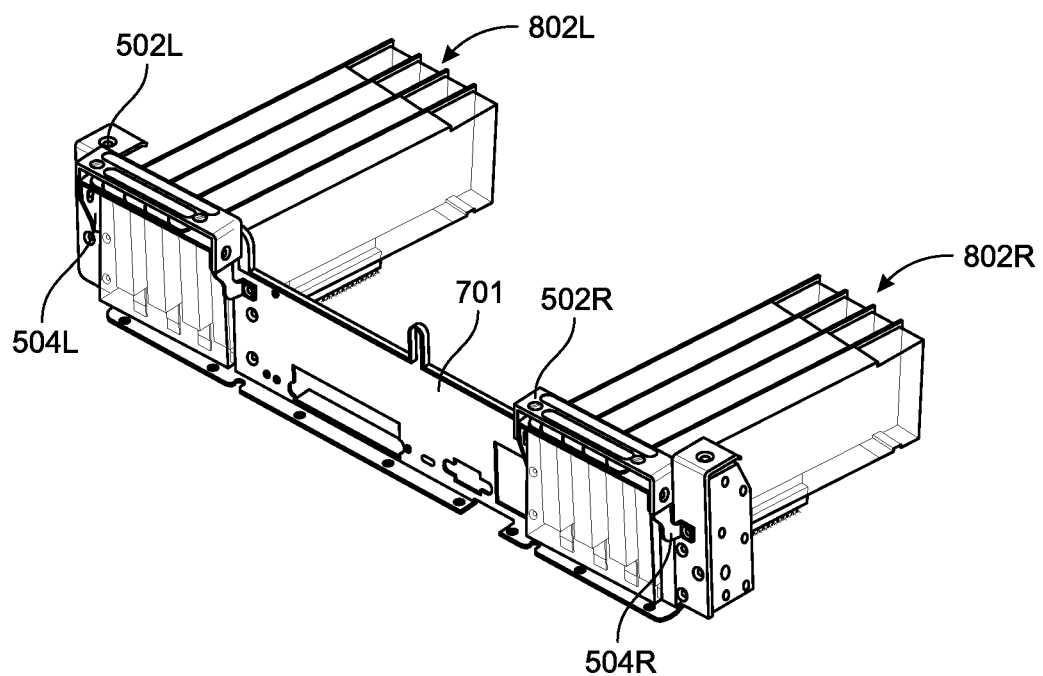

FIG. 8A-8C illustrate a process of installing multiple add-on cards 802L and 802R to the chassis 701 and securing the installed multiple add-on cards 802L and 802R, according to some implementations of the present disclosure. Similar to FIG. 4A, once horizontal portions of the chassis 701 are exposed, the multiple add-on cards 802L and 802R can be installed simultaneously. In FIG. 8B, the securing structures 502L and 502R are rotated to cover portions 813L and 813R of the multiple add-on cards 802L and 802R, respectively. A screwdriver can be rotated in a clockwise direction 724L and 724R to secure the securing structures 502L and 502R to the support brackets 504L and 504R.

Embodiments of the present disclosure provide a tool-less device to fix PCIe cards to a chassis. The device can fix multiple cards simultaneously. Captive screws can be used instead of normal screws to reduce the risk of screws being lost. That is, when captive screws are unscrewed, they are always attached to at least one of the securing structures or the support brackets of the device. Embodiments of the present disclosure solve at least a problem of limited spacing for screw height on a chassis.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. An apparatus for securing multiple cards on a chassis, comprising:
   a securing member;
   a support bracket; and
   at least one hinge configured to hold the securing member to the support bracket such that the securing member has an axis of rotation about the support bracket, wherein a spacing between the securing member and the support bracket is configured to hold a section of the multiple cards, and wherein the spacing between the securing member and the support bracket contains a portion of the chassis when the multiple cards are secured on the chassis.

2. The apparatus of claim 1, wherein the axis of rotation is parallel to a length of the support bracket.

3. The apparatus of claim 1, wherein the axis of rotation is orthogonal to a length of the support bracket.

4. The apparatus of claim 1, further comprising:
   at least one screw for holding the securing member to the support bracket, the at least one screw configured to prevent the securing member from rotating about the axis of rotation.

5. The apparatus of claim 1, wherein the securing member rotates in a plane parallel to a top surface of the support bracket.

6. The apparatus of claim 1, further comprising:
   at least one spring positioned within the spacing between the securing member and the support bracket.

7. The apparatus of claim 1, wherein the securing member is configured to slide along the support bracket, increasing or decreasing the spacing between the securing member and the support bracket.

8. The apparatus of claim 7, wherein the at least one hinge is configured to slide along the support bracket in response to the securing member sliding along the support bracket.

9. The apparatus of claim 8, wherein the securing member is further configured to be placed in at least one of three positions including (a) a first position where a top surface of the securing member is parallel to a top surface of the support member, and the spacing between the securing member and the support bracket is at a first height, (b) a second position where the top surface of the securing member is parallel to the top surface of the support member, and the spacing between the securing member and the support bracket is at a second height larger than the first height, and (c) a third position where the top surface of the securing member, and the top surface of the support member are not parallel to each other.

10. A system comprising:
    a chassis; and
    an apparatus for securing multiple cards on the chassis, the apparatus including a securing member, a support bracket, and at least one hinge,
    wherein the at least one hinge is configured to hold the securing member to the support bracket such that the securing member has an axis of rotation about the support bracket, a spacing between the securing member and the support bracket is configured to hold a section of the multiple cards, a portion of the chassis is contained within the spacing between the securing member and the support bracket, and the support bracket is secured to the chassis at one or more interfaces.

11. The system of claim 10, wherein the axis of rotation is parallel to a length of the support bracket.

12. The system of claim 10, wherein the axis of rotation is orthogonal to a length of the support bracket.

13. The system of claim 10, wherein the apparatus further includes at least one screw for holding the securing member to the support bracket, the at least one screw configured to prevent the securing member from rotating about the axis of rotation.

14. The system of claim 10, wherein the securing member rotates in a plane parallel to a top surface of the support bracket.

15. The system of claim 10, wherein the apparatus further includes at least one spring positioned within the spacing between the securing member and the support bracket.

16. The system of claim 10, wherein the securing member is configured to slide along the support bracket, increasing or decreasing the spacing between the securing member and the support bracket.

17. The system of claim 16, wherein the at least one hinge is configured to slide along the support bracket in response to the securing member sliding along the support bracket.

18. The system of claim 17, wherein the securing member is further configured to be placed in at least one of three positions including (a) a first position where a top surface of the securing member is parallel to a top surface of the support member, and the spacing between the securing member and the support bracket is at a first height, (b) a second position where the top surface of the securing member is parallel to the top surface of the support member, and the spacing between the securing member and the support bracket is at a second height larger than the first height, and (c) a third position where the top surface of the securing member, and the top surface of the support member are not parallel to each other.

19. The system of claim 10, wherein the support bracket is secured to the chassis at the one or more interfaces using one or more rivets.

* * * * *